(12) United States Patent
van der Meulen et al.

(10) Patent No.: US 8,178,829 B2
(45) Date of Patent: May 15, 2012

(54) WAFER PRESCENCE DETECTOR WITH END EFFECTORS HAVING OPTICAL COUPLERS AND FIBERS

(75) Inventors: Peter van der Meulen, Newburyport, MA (US); Paul E. Fogel, Cambridge, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 412 days.

(21) Appl. No.: 12/195,095

(22) Filed: Aug. 20, 2008

(65) Prior Publication Data
US 2009/0095886 A1  Apr. 16, 2009

Related U.S. Application Data

(60) Provisional application No. 60/957,406, filed on Aug. 22, 2007, provisional application No. 60/957,144, filed on Aug. 21, 2007, provisional application No. 60/956,834, filed on Aug. 20, 2007.

(51) Int. Cl.
*G01J 1/04* (2006.01)
*G01N 21/86* (2006.01)

(52) U.S. Cl. .................. 250/227.11; 250/559.3

(58) Field of Classification Search ............ 250/227.11, 250/221, 239, 551, 559.12, 559.13, 559.15, 250/559.39, 216, 559.4, 559.3; 356/615, 356/638, 433–435, 256, 431; 414/935, 936, 414/938; 901/30, 35, 40, 46, 47; 483/901
See application file for complete search history.

(56) References Cited

U.S. PATENT DOCUMENTS

| | | | |
|---|---|---|---|
| 5,796,486 A * | 8/1998 | Jacob | 356/614 |
| 5,981,966 A * | 11/1999 | Honma | 250/559.33 |
| 6,275,748 B1 * | 8/2001 | Bacchi et al. | 700/275 |
| 6,438,449 B2 * | 8/2002 | Kawamatsu et al. | 700/229 |
| 6,529,154 B1 | 3/2003 | Schramm et al. | |
| 6,671,576 B1 * | 12/2003 | Chen | 700/218 |
| 2004/0051060 A1 | 3/2004 | Kurita | |
| 2005/0118009 A1 * | 6/2005 | van der Meulen | 414/744.1 |
| 2006/0234398 A1 | 10/2006 | Gluschenkov | |

FOREIGN PATENT DOCUMENTS

| | | |
|---|---|---|
| KR | 10-2005-0117288 | 12/2005 |
| KR | 10-2006-0040272 | 5/2006 |

* cited by examiner

*Primary Examiner* — Georgia Y Epps
*Assistant Examiner* — Jennifer Bennett
(74) *Attorney, Agent, or Firm* — Colin Durham; Perman & Green, LLP

(57) ABSTRACT

The presence of a workpiece on an end effector of a vacuum robotic handler is detecting using any of a number of non-contact techniques in which some or all of the detection hardware is positioned outside a vacuum chamber that encloses the vacuum robotic handler. Various deployments include laser beam breaking, analysis of radar reflection signals, or analysis of radio frequency identification tag signatures. By providing non-physical couplings between hardware inside and outside of a vacuum environment, integrity of the vacuum is improved. These non-contact techniques are further adapted as described herein to multi-wafer and multi-end effector environments so that independent detection of multiple wafers (e.g., for each end effector) can be performed.

17 Claims, 6 Drawing Sheets

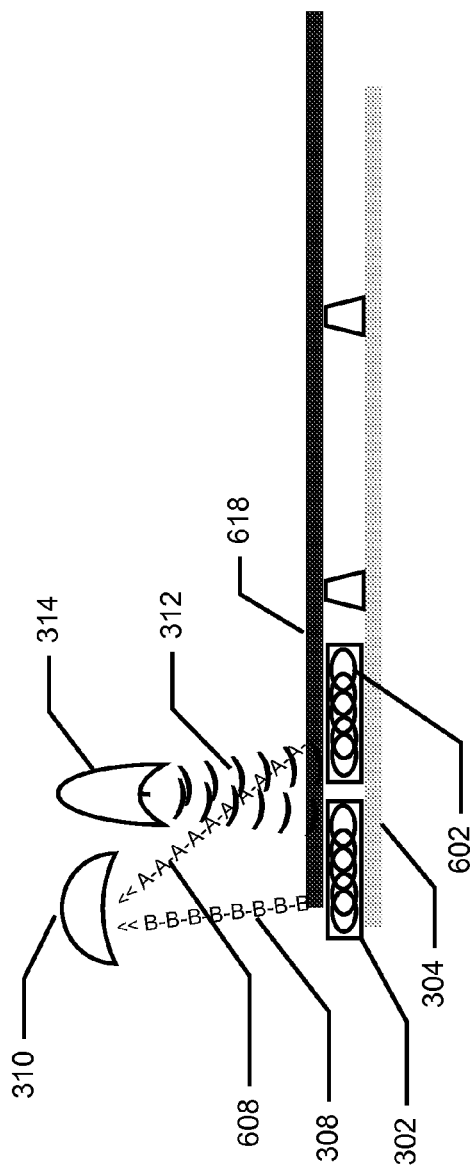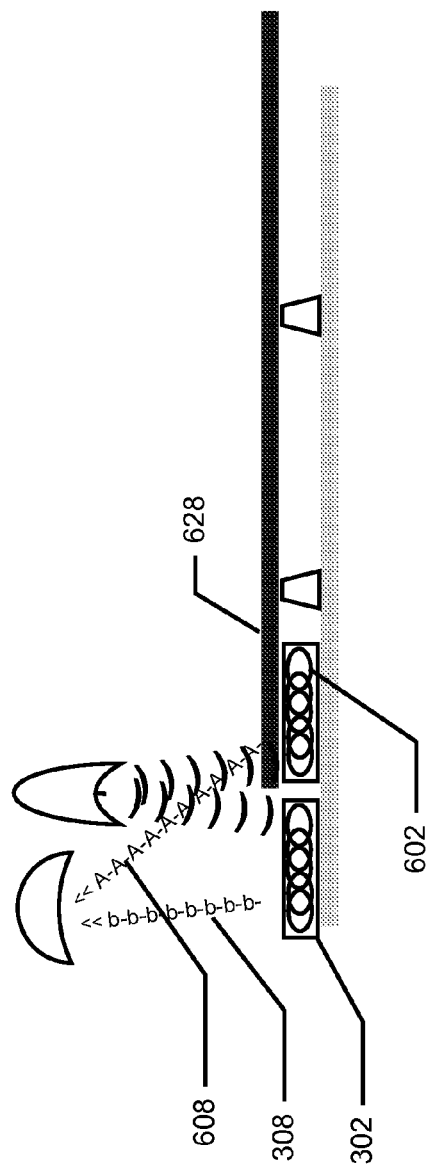

WAFER PRESCENCE DETECTOR WITH END EFFECTORS HAVING OPTICAL COUPLERS AND FIBERS

RELATED APPLICATIONS

This application claims the benefit of U.S. App. No. 60/957,406 filed on Aug. 22, 2007, U.S. App. No. 60/957,144 filed on Aug. 21, 2007, and U.S. App. No. 60/956,834 filed on Aug. 20, 2007. Each of the foregoing applications is incorporated herein by reference in its entirety.

BACKGROUND

This application relates to detecting the presence of a workpiece in a handling environment, and more particularly to detecting the presence of a semiconductor wafer in a vacuum wafer handling system.

While numerous techniques are known for detecting the presence of objects, such as optical beam breaking, radar, sonar, and so forth, many of these techniques are not generally suitable for use in vacuum because the hardware cannot be deployed in vacuum or the hardware requires electrical, optical or other leads for which through-holes in a vacuum chamber must be provided. For high-vacuum applications such as semiconductor fabrication, there remains a need for improved techniques to detect the presence of a semiconductor wafer or the like within a vacuum chamber.

SUMMARY

The presence of a workpiece on an end effector of a vacuum robotic handler is detected using any of a number of non-contact techniques in which some or all of the detection hardware is positioned outside a vacuum chamber that encloses the vacuum robotic handler. Various deployments include laser beam breaking, analysis of radar reflection signals, or analysis of radio frequency identification tag signatures. By providing non-physical couplings between hardware inside and outside of a vacuum environment, integrity of the vacuum is improved. These non-contact techniques are further adapted as described herein to multi-wafer and multi-end effector environments so that independent detection of multiple wafers (e.g., for each end effector) can be performed.

In one aspect, a system disclosed herein includes: a first end effector of a vacuum robotic handler, the vacuum robotic handler positioned within a vacuum chamber and the first end effector having a first pair of optical couplers, one of the optical couplers positioned to receive light from a first laser and coupled to a first source fiber that directs the light across a first workpiece support plane of the first end effector, and another one of the optical couplers positioned to transmit light to a first detector and coupled to a first target fiber that has a receiving end positioned on an opposing side of the first workpiece support plane from the first source fiber and oriented to receive light therefrom; and a second end effector of the vacuum robotic handler, the second end effector having a second pair of optical couplers, one of the optical couplers positioned to receive light from a second laser and coupled to a second source fiber that directs the light across a second workpiece support plane of the second end effector, and another one of the optical couplers positioned to transmit light to a second detector and coupled to a second target fiber that has a receiving end positioned on an opposing side of the second workpiece support plane from the second source fiber and oriented to receive light therefrom.

The second end effector may include a transmissive region positioned to pass light between the first pair of optical couplers and the first laser and the first detector. The first end effector and the second end effector may be independently movably, and the transmissive region may pass light between the first pair of optical couples and the first laser and the first detector only when the first end effector and the second end effector are in a specific relative orientation. The transmissive region of the first end effector may be a hole through the first end effector. The first laser may be positioned outside the vacuum chamber, with the vacuum chamber including a light transmissive wall region that passes light between an interior of the vacuum chamber and the first laser. The first laser may be mounted to the transmissive wall region. The first laser may be positioned to couple to the one of the first pair of optical couplers only when the first end effector is in a predetermined position. The first detector may be positioned outside the vacuum chamber, the vacuum chamber including a light transmissive wall region that passes light between an interior of the vacuum chamber and the first detector. The first detector may be mounted to the transmissive wall region. The second detector may be positioned outside the vacuum chamber. The first laser may be positioned outside the vacuum chamber. The second laser may be positioned outside the vacuum chamber. The system may further include a processing system that measures a light detection signal from at least one of the first detector and the second detector and determines whether a workpiece is present within the workpiece support plane based upon the light detection signal. The system may include a motion control system for the vacuum robotic handler, the motion control system configured to place the vacuum robotic handler in a home position in which wafer presence detection can be performed. The first laser and the second laser may be excited concurrently. The vacuum robotic handler may handle one or more of a reticle and a semiconductor wafer.

In another aspect, a method disclosed herein includes providing a vacuum chamber with a transmissive wall; transmitting a laser beam through the transmissive wall into an interior of the vacuum chamber; directing the laser beam across a workpiece support plane from a first side of the workpiece support plane; detecting the laser beam on an opposing side of the workpiece support plane when a wafer is present within the workpiece support plane, to provide a detected laser beam; transmitting the detected laser beam through the transmissive wall to a detector outside the vacuum chamber, thereby providing a workpiece presence signal; and analyzing the wafer presence signal to determine when the wafer is present.

The method may include detecting the presence of a second wafer with a second laser beam originating outside the vacuum chamber. Directing the laser beam across a workpiece support plane may include coupling the laser beam into an optical fiber. Detecting the laser beam on an opposing side of the workpiece support plane may include coupling the laser beam into an optical fiber.

In another aspect, a system disclosed herein includes: a radar transmitter disposed outside a vacuum workpiece handling enclosure, the radar transmitter producing a radar signal directed toward a plurality of workpieces within the vacuum workpiece handling enclosure; a plurality of radar detectors, two of the plurality of radar detectors disposed outside the vacuum workpiece handling enclosure to receive reflected portions of the radar signal, and one of the plurality of radar detectors disposed inside the vacuum workpiece handling enclosure to receive a non-reflected portion of the radar signal; and a processing system in communication with the radar transmitter and the plurality of radar detectors, the processing system evaluating signals from the plurality of radar detectors to determine whether one or more workpieces are present within the vacuum workpiece handling enclosure.

In another aspect, a method disclosed herein includes projecting a radar signal into an interior of a vacuum workpiece enclosure; receiving portions of the radar signal from a plurality of radar detectors; and analyzing the received portions of the radar signal to determine whether one or more workpieces are present within the interior of the vacuum workpiece enclosure.

Analyzing the received portions of the radar signal may include determining a portion of the radar signal reflected off a first workpiece and through a wall of the vacuum workpiece enclosure to one of the plurality of radar detectors. Analyzing the received portions of the radar signals includes determining a portion of the radar signal transmitted through a non-reflective region of a first workpiece toward a second workpiece and reflected off the second workpiece and passing through a wall of the vacuum workpiece enclosure to one of the plurality of radar detectors. The method may include determining a portion of the radar signal transmitted through the second workpiece to a second one of the plurality of radar detectors, the second one of the plurality of radar detectors positioned inside the vacuum workpiece enclosure.

In another aspect, a system disclosed herein includes a radar transmitter disposed inside a vacuum workpiece handling enclosure, the radar transmitter producing a radar signal directed toward a plurality of workpieces within the vacuum workpiece handling enclosure; a plurality of radar detectors, two of the plurality of radar detectors positioned to receive reflected portions of the radar signal, at least one of the plurality of radar detectors disposed inside the vacuum workpiece handling enclosure to receive a non-reflected portion of the radar signal; and a processing system in communication with the radar transmitter and the plurality of radar detectors, the processing system evaluating signals from the plurality of radar detectors to determine whether one or more workpieces are present within the vacuum workpiece handling enclosure.

At least two of the plurality of radar detectors may be disposed inside the vacuum workpiece handling enclosure.

In another aspect, a system disclosed herein includes a radio frequency identification tag associated with a workpiece; a radio frequency transmitter mounted on a robotic arm of a vacuum robotic handler, the radio frequency transmitter controllable to transmit a stimulus signal for the radio frequency identification tag; a radio frequency receiver that receives an echo signal from the radio frequency identification tag in response to the stimulus signal; and a processor coupled to the radio frequency transmitter to control operation thereof, and coupled to the radio frequency receiver, the processor programmed to evaluate characteristics of the echo signal to determine a location of the radio frequency identification tag, and to infer a presence of a semiconductor wafer based upon the location of the radio frequency identification tag.

In another aspect, a system disclosed herein includes a radio frequency identification tag disposed on an end effector of a robotic arm; a radio frequency transmitter disposed sufficiently near the radio frequency identification tag to activate the radio frequency identification tag with a stimulus signal; a radio frequency receiver that receives an output signal from the radio frequency identification tag in response to the stimulus signal; and a processor coupled to the radio frequency transmitter to control operation thereof, and coupled to the radio frequency receiver, the processor programmed to evaluate characteristics of the output signal to determine a location of the radio frequency identification tag, and to infer a presence of a semiconductor wafer based upon the characteristics of the output signal.

The system may include a plurality of radio frequency identification tags disposed on the end effector, wherein the processor receives and evaluates a corresponding plurality of output signals to determine a presence of the semiconductor wafer. The processor may receive and evaluate the corresponding plurality of output signals to determine a position of the semiconductor wafer. The radio frequency identification tag may transmit a predetermined signal when activated. The radio frequency tag may include a sensor circuit operable to detect proximity of a semiconductor wafer, wherein the radio frequency identification tag transmits a signal indicative of an output from the sensor circuit. The sensor circuit may measure capacitance between an element of the radio frequency tag and a semiconductor wafer.

In another aspect, a method disclosed herein includes transmitting a radio frequency stimulus signal into an interior of a vacuum robotic handler; reflecting the predefined radio frequency stimulus signal off a radio frequency identification tag disposed on an end effector to produce an echo identification signal; and receiving the echo identification signal at a predetermined location, wherein the echo identification signal comprises characteristics based at least in part on a distance from the predetermined location to the radio frequency identification tag.

BRIEF DESCRIPTION OF THE FIGURES

The invention and the following detailed description of certain embodiments thereof may be understood by reference to the following figures:

FIGS. 6A and 6B depict a dual detector configuration of the workpiece detection system of FIG. 3.

DETAILED DESCRIPTION

Figure 1:
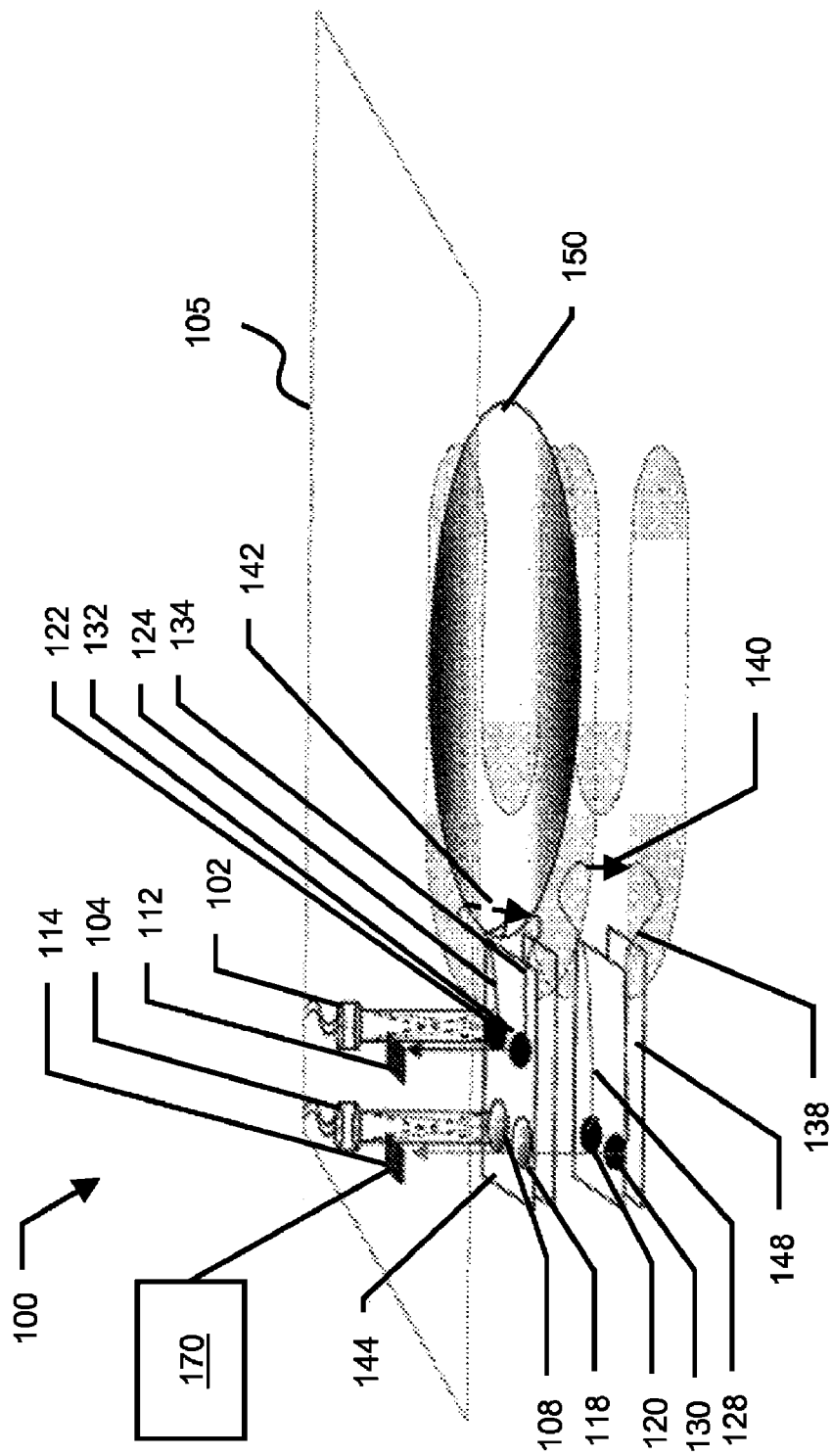
FIG. 1 shows a laser-based dual wafer detection system.

FIG. 1 shows a laser-based dual wafer detection system for use with a vacuum robotic handler. In general, the system 100 can detect the presence of a wafer 150 on an upper robotic arm end effector 144 and of a wafer (not shown) on a lower robotic arm end effector 148 while the robotic arms are stationary, such as in a home position. By adapting a robot arm to include optical couplers, light fibers, and suitably placed transparent portions, wafers on an upper and a lower robotic arm end effector may be detected without relying on the coordinated movement of the arms. It will be understood that, while the following description generally refers to "workpieces", the principles of the invention may be suitably adapted to any substantially planar media that is being handled and/or processed including by way of example semiconductor wafers, reticles, disc media (CD's, DVD's, HD-DVD's, Blu-ray, etc.) and any other similar substrate or the like. Similarly, it will be understood that the principles of the invention may be suitably adapted to a wide range of vacuum handling equipment and end effectors, and all such variations, modifications, and adaptations that would be apparent to one of ordinary skill in the art are intended to fall within the scope of this disclosure.

The dual wafer handling and detection system 100 may include a pair of lasers 102 and 104, which may be positioned outside a vacuum chamber that has a light transmissive top 105, such that light from the lasers 102, 104 is directed through the top 105 into the chamber. The system may also include a pair of laser detectors 112 and 114 positioned outside the vacuum chamber to receive any portion of the laser light that is returned from the dual wafer detection elements inside the vacuum chamber.

The detection elements and method may be substantially similar for detecting a wafer on the upper arm 144 and the lower arm 148. In the following description, the first reference number in each parenthetical set references an element associated with the upper arm 144 and the second reference number references elements associated with the lower arm 148. Differences between the configuration for the upper arm 144 and the lower arm 148 will be noted, although it will be understood that more generally, the techniques described herein may be readily adapted to single wafer detection systems, triple wafer detection systems, other double wafer detection systems (e.g., side-by-side, offset stacked, etc.), and so forth. It will also be understood that with suitable modifications, the lasers 102, 104 and detectors 112, 114 may be positioned within the vacuum environment, which generally entails a trade off between the disadvantages of constructing a wall of a vacuum chamber from a transmissive material and the disadvantages of vacuum-sealing a conduit into the vacuum chamber for optical/electrical connections, or conversely, the advantages of using a conventional aluminum construction for the walls of a vacuum chamber and the advantages of avoiding through-holes and related sealing requirements for the vacuum chamber.

Within the vacuum chamber, a first pair of optical couplers 122, 120 and a second pair of optical couplers 132, 130 may be positioned on a pair of robotic arms 144, 148 so that they couple source light from the lasers 102, 104 to source fibers 124, 128 positioned to direct a beam of light along a plane—referred to herein as a workpiece support plane—where wafer would rest on the robotic arm end effectors if present. The resulting workpiece detection beams 142, 140 are received by target fibers 134, 139 when a wafer is not present. The workpiece detection beams 142, 140 are carried by the target fibers 134, 138 to the second pair of optical couplers which transmit the received beams 142, 140 through the top 105 to laser collectors 112, 114. Suitable lasers, couplers, fibers, and the like will be readily apparent to one of skill in the art, and are not described in detail here.

With a workpiece properly positioned on the robotic arm 144, 148, and the robotic arm 144, 148 properly positioned in a stationary position, such as a home position, the workpiece detection beam 142,140 may be interrupted or attenuated by the workpiece so that a reduced amount of the beam impacts a receiving area on an end of the receiving light fibers 134, 138. The workpiece may entirely or partially block the workpiece detection beam 142, 140. In other embodiments, the workpiece detection beam 142, 140 may reflect off of an edge of the workpiece, or may reflect off of surface features of the workpiece. Some portion of the projected light and any reflected light may reach the receiving light fibers 134, 138. When the projected light in the workpiece detection beam 142, 140 reaches the receiving light fibers 134, 138 substantially undisturbed (e.g. the workpiece is not present, the workpiece is not properly positioned, or the robotic arm 144, 148 is not properly positioned), a processing system 170 that analyzes signals from the detectors 112, 114 may infer that a workpiece is absent. The processing system 170 may in general measure the detected laser light, with any differences or variations noted and corresponding inferences drawn. For example, a substantial difference, such as a reduction beyond a predetermined threshold, may indicate a presence of a wafer on the robotic arm 144, 148. To facilitate distinguishing an error condition that causes complete interruption of the laser light, such as an object blocking the light or the light fiber 124, 128 being misaligned, the dual wafer handling and detection system 100 may be configured to ensure that at least a portion of the projected light reaches the receiving light fibers 134, 138 when a properly positioned workpiece is on an end effector.

A presence of a workpiece on the upper robotic arm 144 and the lower robotic arm 148 may be determined at the same time and/or independently by properly positioning both of the robotic arms in a stationary position such as a home position. The upper robotic arm 144 may include optically transparent portions, such as through-holes or any translucent/transparent material suitable for in-vacuum use, positioned directly in the light path from the laser 104 to the coupler 120 and the light path from the coupler 130 to the detector 114. In an example, the optically transparent portion 108 of the upper arm 144 may facilitate a laser 104 transferring light directly to the detector 120 even when the upper arm 144 is positioned between the laser 104 and the coupler 120.

With the upper robotic arm 144 and the lower robotic arm 148 positioned substantially as shown in the dual wafer handling and detection system 100 of FIG. 1, a presence of two wafers (a workpiece supported by the upper robotic arm 144 and a workpiece supported by the lower robotic arm 148) may be detected without requiring either the upper robotic arm 144 or the lower robotic arm 148 to be moved out of the way of the laser light paths. The dual wafer handling and detection system 100 may also facilitate detecting both an upper workpiece and a lower workpiece independently of each other. Each laser-coupler-fiber-beam-fiber-coupler-detector path can be excited independently or at the same time for faster, substantially simultaneous wafer detection.

The dual wafer handling and detection system 100 may communicate with the robotic arms 144, 148 motion control system to determine when the robotic arms 144, 148 are in position prior to exciting the lasers 102, 104, or to position the robotic arms 144, 148 in a location for wafer detection. In general the lasers 102, 104 are stationary relative to the robotic arm vacuum enclosure. Typically, the elements of the dual wafer handling and detection system 100 are also held in a stationary position on the robotic arms 144, 148 during wafer detection. However, in embodiments the lasers 102, 104 and related hardware may move in coordination with the robotic arm to facilitate wafer detection in a range of locations.

Although the optically transparent portions 108, 118 of the upper robotic arm 144 facilitate projecting light through the upper robotic arm 144, the dual wafer handling and detection system 100 may detect a workpiece on the lower robotic arm 148 even when the upper robotic arm 144 is in a position other than the home position. As long as a non-transparent portion of the upper arm 144 does not interfere with the light path associated with detecting a workpiece on the lower robotic arm 148, the upper robotic arm 144 may be in any position or may be moving relative to the lower arm 148 while the presence of a workpiece on the lower robotic arm 148 is detected. Similarly, detecting a workpiece on the upper arm 144 can be done independently of the position or existence of the lower robotic arm 148. Likewise, the lasers 102, 104 may be positioned such that the robotic arm 144, 148 may be stopped at any other position in its range of motion under a transparent portion of the robotic vacuum enclosure cover. Through an appropriate selection of properties for the lasers 102, 104, the optical couplers 120, 122, 130, 132, the optically transparent portions 108, 118 of the upper arm 144, and the laser detectors 112, 114, the wafer detection may be performed while the robotic arm 144, 148 is in motion. Therefore, although a home position of the robotic arms 144, 148 may be a convenient position for detecting the presence of workpieces, the invention is not limited to this position, nor to any particular robotic arm 144, 148 position except as herein described.

In an alternative configuration of the dual wafer handling and detection system 100, a single laser 102 and a single detector 112 may be used to detect the presence of a wafer supported by the upper arm 144 and a workpiece supported by the lower arm 148. In this configuration, the upper robotic arm 144 is positioned so that the optical couplers 122 and 132 are positioned to form a light path between the laser 102 and the detector 112. The laser 102 is excited and the detector 112 is measured to determine an amount of light passing from the laser 102 to the detector 112 through the dual wafer handling and detection system 100 elements associated with the upper robotic arm 144. The upper robotic arm 144 may then be moved so that the light path between the optical couplers 120 and 130 associated with the lower robotic arm 148 forms a light path with the laser 102 and detector 112. The laser 102 is again excited and the detector 112 is measured to determine an amount of light passing from the laser 102 through the optical elements associated with the lower robotic arm 148. The upper robotic arm 144 may be moved so that no portion of the upper robotic arm 148 affects the path of laser 102 by positioning the transparent portions 108 and 118 in the laser 102 light path. In this configuration, a single laser may be used to detect both an upper workpiece and a lower workpiece while requiring that only the upper robotic arm 144 be moved in a coordinated manner.

The laser 102 and 104 may be any type of laser that generates light that is compatible with detection by optical couplers and transmission through light fiber. Laser types may include gas, chemical, dye, metal-vapor, solid-state, semiconductor, and the like. Visible light that is emitted from laser 102 and 104 may be any color, such as red, yellow, and the like. The light fiber 124, 128, 134, and 138 may be flexible glass, plastic, or the like designed to guide light along it length by confining as much light as possible in a propagating form. The light fiber may comprise a large core that relies on total internal reflection, or a smaller core that confines light by establishing a waveguide. The fiber may include one or more of graded-index optical fibers, step-index optical fibers, birefringent polarization-maintaining fibers, photonic crystal fibers, and the like.

In another embodiment of a wafer detection system, radar may provide a medium for detecting a presence of one or more workpieces in a vacuum workpiece handling environment such as a vacuum semiconductor handling and fabrication system. Radar transmission in atmosphere and vacuum may facilitate detecting one or more workpieces that are vertically displaced from one another. Because radar may both reflect and pass through materials, the reflecting and transmitting properties of radar may be employed to identify the one or more workpieces.

Figure 2:
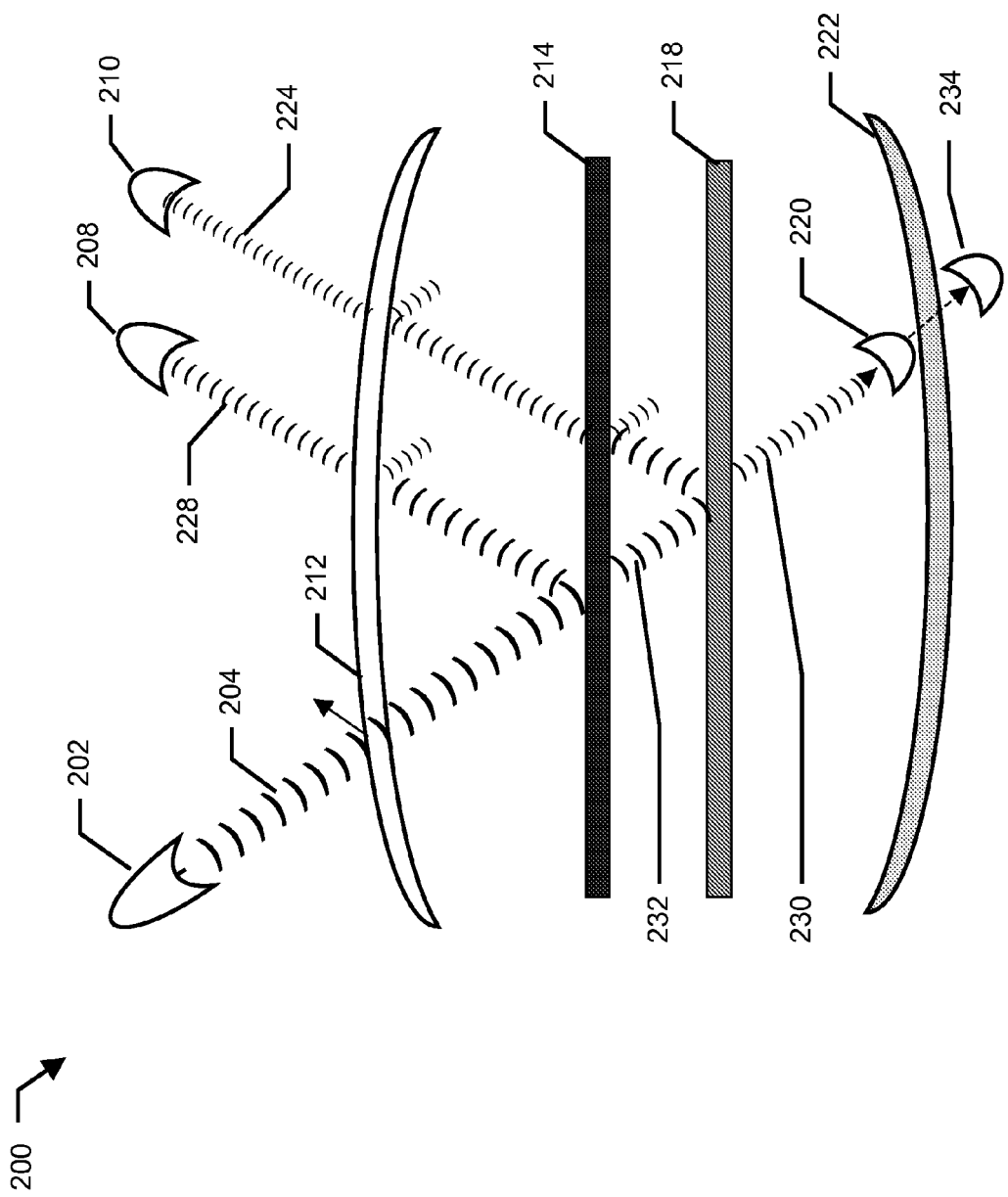
FIG. 2 shows a radar-based dual wafer detection system.

The radar-based dual workpiece sensing system 200 of FIG. 2 incorporates radar signal reflection and transmission properties to facilitate detecting at least a first and a second wafer being handled in a vacuum environment using a single radar transmitter. Because radar does not require a line of sight presentation of the item being detected by the radar, the radar-based dual workpiece sensing system 200 may be employed with vacuum enclosures that do not have a glass cover.

FIG. 2 shows a radar-based dual wafer detection system. In the embodiment of FIG. 2 the radar-based dual workpiece sensing system 200 comprises a radar transmitter 202, atmosphere radar detectors 208 and 210, vacuum radar detector 220, and a processing system (not shown) for controlling the system 200 and processing the radar signals detected by the detectors 208, 210, and 220. A radar signal 204 generated by the radar transmitter 202 may pass through the enclosure top cover 212 substantially intact and impact a first wafer 214. A portion of the radar signal 204 may be reflected from the top cover 212. A portion of the radar signal 204 will be reflected off of the first workpiece 214 and a portion will be transmitted through the first workpiece 214. The reflected portion may pass through the top cover 212 substantially unchanged to become a first reflected radar signal 228, while a portion of the reflected portion may further be reflected from the top cover 212. The first radar detector 208 may receive the first reflected radar signal 228 and communicate information representing the detected first radar signal 228 to the processing system. The transmitted portion 232 may be attenuated by the first workpiece 214 and may impact a second workpiece 218. The transmitted portion 232 may be further attenuated as it impacts the second workpiece 218 and may be split into at least a second reflected radar signal 224 and a residual radar signal 230. The second reflected radar signal 224 may be further attenuated as it transmits through the first workpiece 214 and then through the top cover 212 before impacting the second atmosphere radar detector 210. The residual radar signal 230 may be detected by internal radar detector 220.

As shown in FIG. 2, each radar signal impacting an object such as a workpiece or a cover may be attenuated and reflected by the object. The amount of attenuation and any reflection are dependent on at least the presence of the object. In an example, the first reflected radar signal 228 would not be present if the first workpiece 214 were not present. Also attenuated radar signal 232 would not be attenuated and therefore would be the same as radar signal 204. In this example, the first detector radar detector 208 would receive no radar signal while the second radar detector 210 would receive a signal reflected off of the second workpiece 218. The signal reflected off of the second workpiece 218 may result in detector 210 indicating a larger detected value than if the first workpiece 214 were present. Likewise, in this example, the residual radar detector 220 would indicate a larger detected value.

A generalization of the principals described and exemplified herein may be represented by the following grid. Each column Wx indicates the presence (P) or absence (A) of the first workpiece 214 (W1) and the second workpiece 218 (W2). Ax represents attenuation of workpiece 'x' and Rx represents reflection from workpiece 'x'. The formulas in the grid represent how the presence of each workpiece may impact detection of a radar signal by the first radar detector 208 (FD), the second radar detector 210 (SD), and the residual radar detector (RD). S represents the source radar signal 204, and f represents a formula adapted to compute an expected radar signal value at each detector.

| W1 | W2 | RD | FD | SD |
|----|----|----|----|----|
| P | P | f(S, A1, A2) | f(S, R1) | f(S, A1, R2) |
| P | A | f(S, A1) | f(S, R1) | f(0) |

-continued

| W1 | W2 | RD | FD | SD |
|----|----|-----|------|--------|
| A | P | f(S, A2) | f(0) | f(S, R2) |
| A | A | f(S) | f(0) | f(0) |

The above grid provides a visualization of potential differences in detected values at each of the detectors based on the presence of each of the workpieces. As is shown in the rows of the grid, each combination of workpieces 214 and 218 results in a different set of formulas representing the detected radar signals. Consequently, a processing system may determine the presence of each workpiece based on a comparison of the resulting detected radar signal at each detector with the expected radar signal value based on the formulas in the grid.

The radar transmitter 202 may include a conical antenna to direct the radar signal 204 in a narrow path, thereby reducing the potential of random reflections affecting the detection of the first reflected radar signal 228 or the second reflected radar signal 224. The radar transmitter 202 may be pulsed and may be timed to transmit the radar signal 204 when a workpiece handling robotic arm has positioned the workpieces for detection. It may be possible to perform radar-based dual workpiece detection when the workpieces are stationary or moving.

The residual radar signal detector 220 may be positioned inside the enclosure as shown in FIG. 2. Alternatively the residual radar signal detector 220 may be positioned outside the enclosure as represented by element 234. When the residual radar signal detector is positioned as element 234, the residual radar signal 230 may pass through the bottom cover 222 before being detected.

Alternatively, the residual radar signal detector 220 may be left out of the configuration so that the presence of the workpieces is detected by analyzing the detection of the first reflected radar signal 228 and the detection of the second reflected radar signal 224. In this configuration, the residual radar signal 230 is not detected.

In another embodiment, detecting workpiece presence in a vacuum processing system may be facilitated by a contactless, wireless, passive proximity detection system positioned on a robotic arm so that a workpiece properly supported by the robotic arm is in close proximity to the detection system. The detection system may include a circuit that, when stimulated by a radio signal, produces a radio frequency echo. The radio frequency echo signal may vary based on a distance between the workpiece and the circuit. The circuit may include elements that interact with the workpiece and therefore produce an echo signal characterized by the interaction.

FIGS. 3 through 6 show various configurations of a radio frequency proximity-based workpiece detection system 300.

Figure 3:
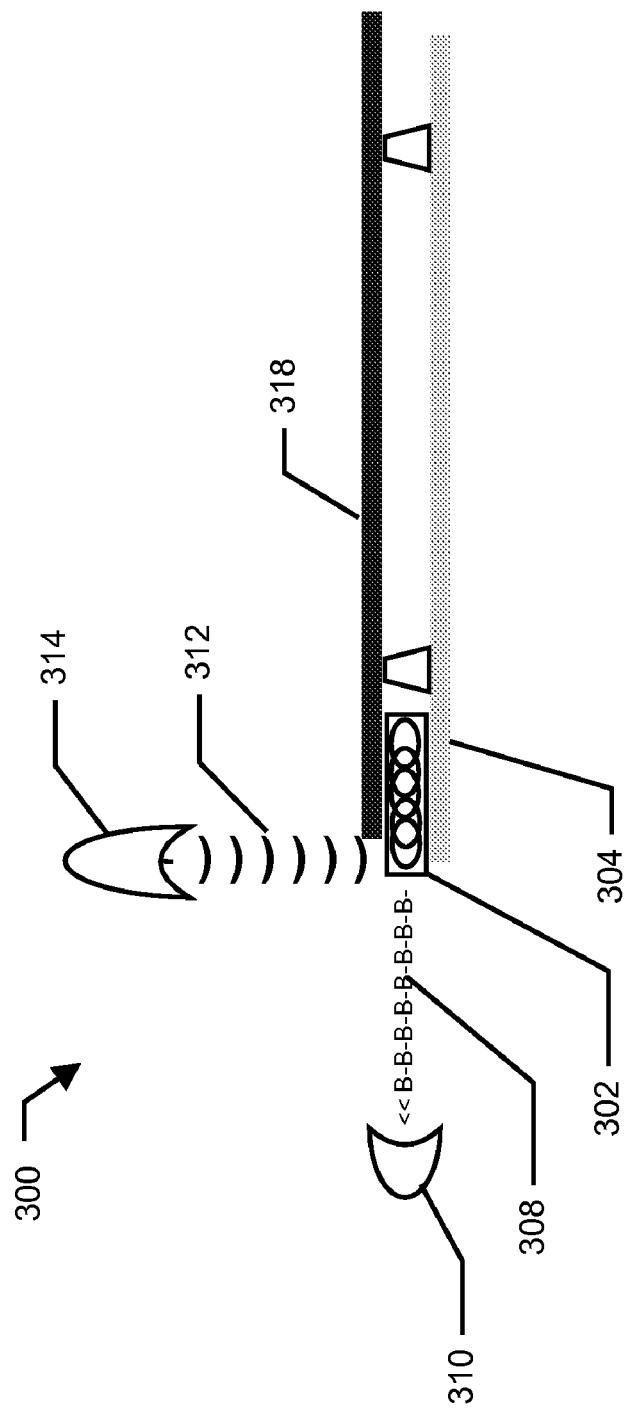
FIG. 3 shows a single radio-frequency-based wafer detection system.

FIG. 3 shows a single radio-frequency-based wafer detection system. In FIG. 3, a workpiece is detected using a proximity-based technique wherein an adaptable identification tag 302, positioned on a robotic arm 304 so that a workpiece 318 properly supported by the robotic arm 304 is in close proximity to the identification tag 302. A radio transmitter 314 may transmit a radio frequency stimulus signal 312 so that the stimulus signal 312 reaches the identification tag 302. The identification tag 302 may echo or reflect the stimulus signal 312 using a circuit. The radio stimulus signal 312 may enter the circuit and interact with elements of the circuit to produce an echo signal 308 that may be detected by a radio receiver 310. Based on the proximity of the workpiece 318 to the circuit, the echo signal 308 may include characteristics that are detectable by the receiver 310. When the workpiece 318 is close to the identification tag 302, the detectable characteristics of the echo signal 308 may be different than when the workpiece 318 is not in close proximity to the identification tag 302.

A circuit may be affected by a proximity to a workpiece in a variety of ways. Capacitance-based proximity detection is an example of how the workpiece 318 may impact the circuit. In this example, a capacitance is established between elements of the circuit and when the workpiece 318 comprises a conductive material, (e.g. a semiconductor wafer) the capacitance established in the circuit is changed when the workpiece 318 is close to the circuit. The identification tag 302 uses the circuit, and therefore the established capacitance in the circuit to produce an echo signal. A frequency characteristic of the echo signal may be based on the established capacitance and therefore will vary based on the proximity of the workpiece.

The identification tag 302 may be passive or active. A passive identification tag 302 may derive the energy needed to power it from the stimulus signal 312. The energy obtained by the tag 302 may facilitate the tag 302 transmitting the response or echo signal 308. The response or echo signal 308 may be generated by modulating impedance the tag 302 presents to the stimulus signal 312. In the example capacitance-based example above, the modulation of the impedance may be impacted by the established frequency that is based on the proximity of the workpiece 318.

Figure 4:
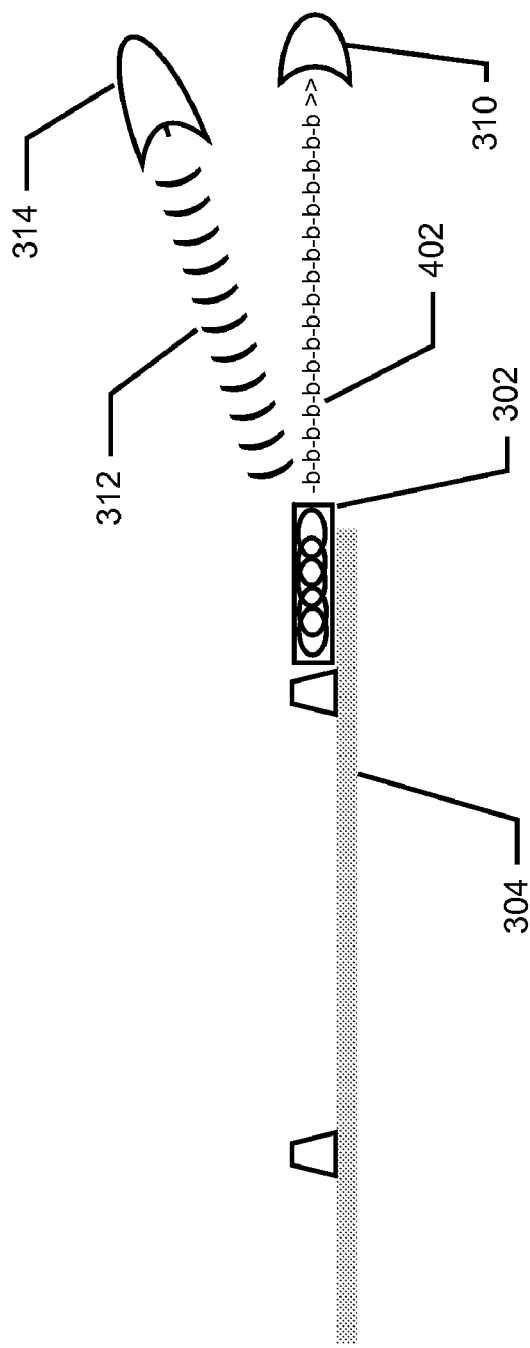
FIG. 4 shows the wafer detection system of FIG. 3 without a workpiece.
Figure 5:
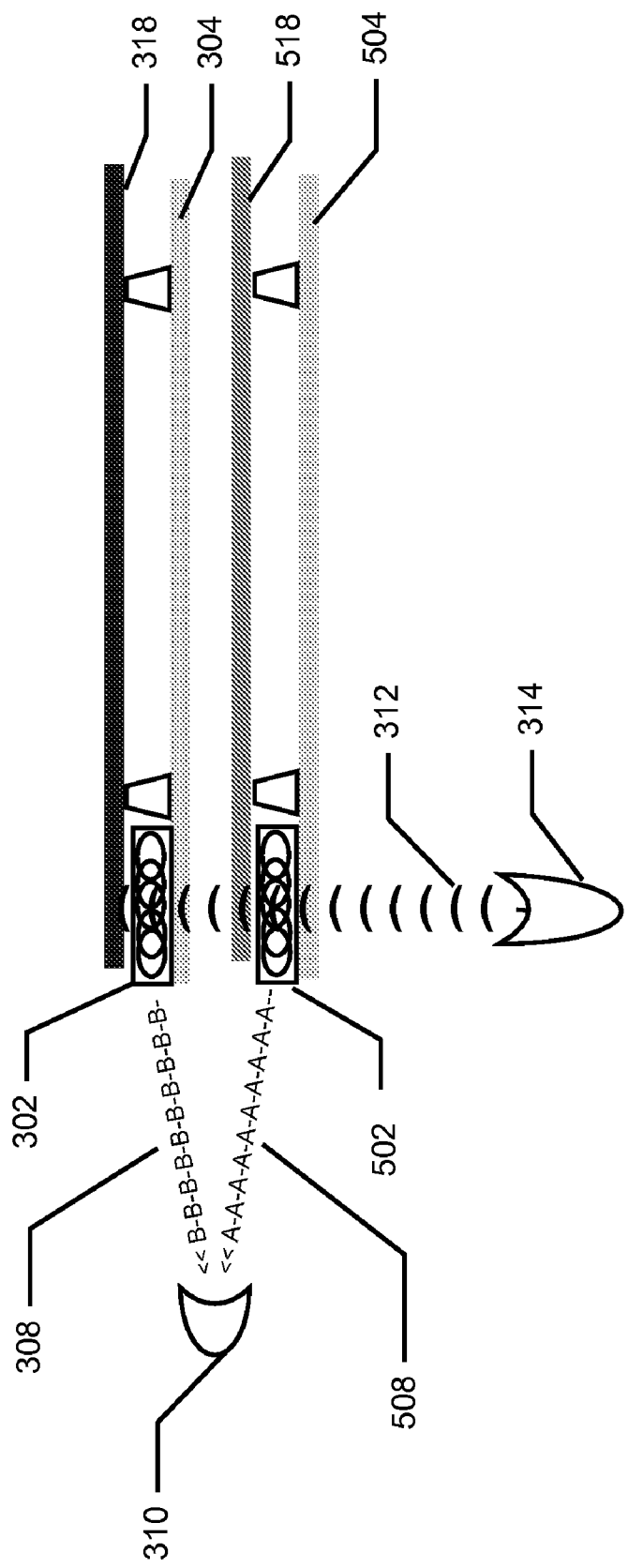
FIG. 5 shows a dual workpiece detection system.

FIG. 4 shows the wafer detection system of FIG. 3 without a workpiece. The response or echo signal 308 of the configuration depicted in FIG. 3 is distinguished from the echo signal 408 of the configuration depicted in FIG. 4 by the characters shown. Echo signal 308 of FIG. 3 is impacted by the workpiece 318 and is consequently depicted as comprising "B–". Echo signal 408 of FIG. 4 is not impacted by the workpiece 318 (which has been removed) and is consequently depicted as comprising "b–". An actual signal may include a variety of characters, attributes, characteristics, frequencies, energies, and the like. These signal representations are to indicate a difference between the echo signal 308 when the workpiece 318 is in close proximity to the tag 302 and the echo signal 408 when the workpiece 318 is not in close proximity to the tag 302. FIG. 4 also depicts a different orientation of the stimulus signal 312 and transmitter 314 than that shown in FIG. 3 because the orientation of the transmitter 314 and tag 302 is not critical for the invention. A directional transmitter, as depicted in FIGS. 3, 4, and 5, may be directed toward the tag 302. An omni-direction transmitter may not need to be thusly directed. Additionally, the echo signal 308 may not be a directional signal and therefore the position of the radio receiver 310 may not be limited. Factors, such as the echo signal 308 strength and any absorption or reflection of the signal by the aspects of the configuration may determine a preferred position of the receiver 310.

Referring to FIG. 5, the proximity-based detection system 300 may be configured with more than one identification tag to facilitate determining the presence of a plurality of workpieces. A robotic handling system, such as a vacuum semiconductor handling system, may include handling a plurality of workpieces on independent or dependent robotic arms. The embodiment of FIG. 5 depicts a configuration wherein two workpieces 318, 518 are supported on robotic arms, one above the other. A first robotic arm 304 supports a first workpiece 318 that is sensed by a first identification tag 302. A second robotic arm 504, positioned below the first robotic arm 304, supports a second workpiece 518 that is sensed by a second identification tag 502. A single radio transmitter 314 may transmit a stimulus signal 312 that interacts with each tag. In response to the stimulus signal 314, each tag may transmit an echo signal that may include characteristics that distinguish an echo signal 308 associated with tag 302 from an echo signal 508 associated with tag 502. Radio receiver 310 may receive one or more of the transmitted echo signals 308, 508 for detection of a presence of workpiece 318 and/or workpiece 518.

Each tag may be disposed on a robotic arm so that a workpiece properly supported by the robotic arm may influence how each tag responds to the stimulus signal 312. Although the configuration of FIG. 5 depicts the upper robotic arm 304 and lower robotic arm 504 vertically aligned, no such alignment is required for detection of a workpiece on either arm. Therefore, the proximity-based workpiece detection system 300 may facilitate the detection of workpieces on a plurality of robotic arms without requiring predetermined positioning or coordination of movement of the robotic arms. Even if the workpieces are not visible to an operator of the robotic handling system, their presence while being properly supported by a robotic arm may be detected. Although FIG. 5 depicts a two workpiece configuration, the proximity-based workpiece detection system 300 is not limited to only one or two workpiece detection. Because each tag may be preconfigured with a unique identifier that may impact an echo signal transmitted by the tag in response to a stimulus signal, any number of tags may be configured in the system 300.

Radio signals detected by radio receiver 310 may be processed by a processing system, such as a computing system, to determine the presence of the workpieces as they are being handled. The proximity-based workpiece detection system 300 may also be beneficially applied during a workpiece pickup or drop-off operation to facilitate detecting a workpiece prior to pickup, after pickup, prior to drop-off, and ensure the workpiece is no longer supported by the robotic arm after drop-off.

FIGS. 6A and 6B depicts an alternate configuration of the proximity-based workpiece detection system 300 wherein two tags are configured to facilitate detecting a workpiece size in addition to the workpiece proximity. Based on characteristics of an echo signal 608, the workpiece 318 presence may be detected. Based on characteristics of the echo signal 308, the workpiece 318 size may be determined. The following combinations of echo signals indicate the presence and size of the workpiece as shown in FIGS. 6A and 6B. In one encoding scheme, an echo signal 608="a–" may indicate no workpiece present (not shown). An echo signal 608="A–" may indicate a workpiece is present (FIGS. 6A and 6B). An echo signal 608="A–" and echo signal 308="b–" may indicate a small workpiece 628 is present (FIG. 6B). An echo signal 608="A–" and echo signal 308="B–" may indicate a large workpiece 618 is present (FIG. 6A). It will be understood that the echo signal or output signal may be adapted in various ways to assist in wafer detection and centering. For example, in one aspect, each tag may simply transmit a predetermined response when activated, using conventional RFID tag technology. The output may be detected (either from within a vacuum chamber, or using RF detectors positioned outside the vacuum chamber) and a processor may infer the presence/position of a wafer based upon the characteristics of the detected output signal. Thus, where a wafer affects propagation of the output signal, these effects can be measured and used to draw inferences concerning wafer presence. In another aspect, each tag may include wafer detection circuitry, such as based upon measurements of capacitance between the tag (or an element of the tag such as a metal pad or the like) and a wafer. This wafer sensor may in turn be used to selectively control output from the tag, such as by selecting one of a discrete set of output signals, or by encoding the measured capacitance in digital or analog form and transmitting the measured capacitance to an RF detector. Where a number of such tags are disposed on an end effector, accurate position data may also be obtained for a wafer. It will be understood that a single tag system may also be employed for detecting position; however, a simple point measurement of capacitance may not be readily converted into wafer position, and may be more generally employed to draw general conclusions about whether a wafer is on center than specific conclusions about two or three dimensional wafer position. A number of other similar techniques may be suitably adapted for use with a radio frequency identification tag system for determining wafer presence and/or position.

The elements depicted in flow charts and block diagrams throughout the figures imply logical boundaries between the elements. However, according to software or hardware engineering practices, the depicted elements and the functions thereof may be implemented as parts of a monolithic software structure, as standalone software modules, or as modules that employ external routines, code, services, and so forth, or any combination of these, and all such implementations are within the scope of the present disclosure. Thus, while the foregoing drawings and description set forth functional aspects of the disclosed systems, no particular arrangement of software for implementing these functional aspects should be inferred from these descriptions unless explicitly stated or otherwise clear from the context.

Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods or processes described above, and steps thereof, may be realized in hardware, software, or any combination of these suitable for a particular application. The hardware may include a general-purpose computer and/or dedicated computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as computer executable code created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, means for performing the steps associated with the processes described above may include any of the hardware and/or software described above. All such permutations and combinations are intended to fall within the scope of the present disclosure.

While the invention has been disclosed in connection with the preferred embodiments shown and described in detail, various modifications and improvements thereon will become readily apparent to those skilled in the art. Accordingly, the spirit and scope of the present invention is not to be limited by the foregoing examples, but is to be understood in the broadest sense allowable by law.

All documents referenced herein are hereby incorporated by reference.

What is claimed is:

1. A system comprising:
    a first and second laser;
    a first and second detector;
    a first end effector of a vacuum robotic handler, the vacuum robotic handler positioned within a vacuum chamber and the first end effector having a first pair of optical couplers, one of the optical couplers being positioned to receive light from the first laser across a vacuum gap and the one of the optical couplers being configured to couple the light from the first laser to a first source fiber that directs the light across a first workpiece support plane of the first end effector, and another one of the optical couplers being positioned to transmit light to the first detector across the vacuum gap and the another one of the optical couplers being configured to couple light from a first target fiber, that has a receiving end positioned on an opposing side of the first workpiece support plane from the first source fiber and oriented to receive light therefrom, to the first detector so that placement of a workpiece on the first end effector in the first workpiece support plane is detected; and
    a second end effector of the vacuum robotic handler, the second end effector having a second pair of optical couplers, one of the optical couplers being positioned to receive light from the second laser across the vacuum gap and the one of the optical couplers being configured to couple the light from the second laser to a second source fiber that directs the light across a second workpiece support plane of the second end effector, and another one of the optical couplers being positioned to transmit light to the second detector across the vacuum gap and the another one of the optical couplers being configured to couple light from a second target fiber, that has a receiving end positioned on an opposing side of the second workpiece support plane from the second source fiber and oriented to receive light therefrom, to the second detector so that placement of a workpiece on the second end effector in the second workpiece support plane is detected.

2. The system of claim 1 wherein the second end effector further includes a transmissive region positioned to pass light between the first pair of optical couplers and the first laser and the first detector.

3. The system of claim 2 wherein the first end effector and the second end effector are independently movably, the transmissive region passing light between the first pair of optical couplers and the first laser and the first detector only when the first end effector and the second end effector are in a specific relative orientation.

4. The system of claim 2 wherein the transmissive region of the second end effector is a hole through the second end effector.

5. The system of claim 1 wherein the first laser is positioned outside the vacuum chamber, the vacuum chamber including a light transmissive wall region that passes light between an interior of the vacuum chamber and the first laser.

6. The system of claim 5 wherein the first laser is mounted to the transmissive wall region.

7. The system of claim 5 wherein the first laser is positioned to couple to the one of the first pair of optical couplers only when the first end effector is in a predetermined position.

8. The system of claim 1 wherein the first detector is positioned outside the vacuum chamber, the vacuum chamber including a light transmissive wall region that passes light between an interior of the vacuum chamber and the first detector.

9. The system of claim 8 wherein the first detector is mounted to the transmissive wall region.

10. The system of claim 8 wherein the second detector is positioned outside the vacuum chamber.

11. The system of claim 10 wherein the first laser is positioned outside the vacuum chamber.

12. The system of claim 11 wherein the second laser is positioned outside the vacuum chamber.

13. The system of claim 1 further comprising a processing system that measures a light detection signal from at least one of the first detector and the second detector and determines whether a workpiece is present within the workpiece support plane based upon the light detection signal.

14. The system of claim 1 further comprising a motion control system for the vacuum robotic handler, the motion control system configured to place the vacuum robotic handler in a home position in which wafer presence detection can be performed.

15. The system of claim 1 wherein the first laser and the second laser are excited concurrently.

16. The system of claim 1 wherein the vacuum robotic handler handles one or more of a reticle and a semiconductor wafer.

17. A system comprising:
    a first and second laser;
    a first and second detector;
    a first end effector of a vacuum robotic handler, the vacuum robotic handler positioned within a vacuum chamber and the first end effector having a first pair of optical couplers, one of the optical couplers being positioned to receive light from the first laser across a vacuum gap and the one of the optical couplers being configured to couple the light from the first laser to a first source fiber that directs the light across a first workpiece support plane of the first end effector, and another one of the optical couplers being positioned to transmit light to the first detector across the vacuum gap and the another one of the optical couplers being configured to couple light from a first target fiber, that has a receiving end positioned on an opposing side of the first workpiece support plane from the first source fiber and oriented to receive light therefrom, to the first detector; and
    a second end effector of the vacuum robotic handler, the second end effector having a second pair of optical couplers, one of the optical couplers being positioned to receive light from the second laser across the vacuum gap and the one of the optical couplers being configured to couple the light from the second laser to a second source fiber that directs the light across a second workpiece support plane of the second end effector, and another one of the optical couplers being positioned to transmit light to the second detector across the vacuum gap and the another one of the optical couplers being configured to couple light from a second target fiber, that has a receiving end positioned on an opposing side of the second workpiece support plane from the second source fiber and oriented to receive light therefrom, to the second detector;

wherein the first laser is positioned outside the vacuum chamber, the vacuum chamber including a light transmissive wall region that passes light between an interior of the vacuum chamber and the first laser.

\* \* \* \* \*

UNITED STATES PATENT AND TRADEMARK OFFICE
CERTIFICATE OF CORRECTION

PATENT NO. : 8,178,829 B2  
APPLICATION NO. : 12/195095  
DATED : May 15, 2012  
INVENTOR(S) : van der Meulen et al.

Page 1 of 1

It is certified that error appears in the above-identified patent and that said Letters Patent is hereby corrected as shown below:

Title Page, Item (54) and in the specifications, Column 1, line 1, Title, delete "PRESCENCE" and insert --PRESENCE-- therefor.

Signed and Sealed this
Fourth Day of June, 2013

Teresa Stanek Rea
*Acting Director of the United States Patent and Trademark Office*